United States Patent
Xu et al.

(10) Patent No.: US 11,472,948 B2
(45) Date of Patent: Oct. 18, 2022

(54) ENCAPSULATING COMPOSITION AND ENCAPSULATING FILM COMPRISING SAME AND ELECTRONIC COMPONENT ASSEMBLY

(71) Applicant: HANGZHOU XINGLU TECHNOLOGIES CO., LTD, Zhejinag (CN)

(72) Inventors: Tao Xu, Hangzhou (CN); Zhisheng Fu, Hangzhou (CN); Anyang Wu, Hangzhou (CN)

(73) Assignee: HANGZHOU XINGLU TECHNOLOGIES CO., LTD., Hangzhou (CN)

( * ) Notice: Subject to any disclaimer, the term of this patent is extended or adjusted under 35 U.S.C. 154(b) by 121 days.

(21) Appl. No.: 16/633,497

(22) PCT Filed: Jul. 24, 2018

(86) PCT No.: PCT/CN2018/096742
§ 371 (c)(1),
(2) Date: Jan. 23, 2020

(87) PCT Pub. No.: WO2019/019986
PCT Pub. Date: Jan. 31, 2019

(65) Prior Publication Data
US 2020/0216647 A1    Jul. 9, 2020

(30) Foreign Application Priority Data

| Jul. 25, 2017 | (CN) | 201710612989.5 |
| Dec. 18, 2017 | (CN) | 201711364857.1 |
| Dec. 18, 2017 | (CN) | 201711366329.X |
| Jul. 20, 2018 | (CN) | 201810804371.3 |

(51) Int. Cl.
C08L 23/06 (2006.01)
H01L 31/04 (2014.01)
C08L 23/08 (2006.01)
H01L 31/048 (2014.01)
C08L 23/04 (2006.01)

(52) U.S. Cl.
CPC ............. *C08L 23/06* (2013.01); *C08L 23/04* (2013.01); *C08L 23/0815* (2013.01); *H01L 31/0481* (2013.01); *C08L 2203/204* (2013.01)

(58) Field of Classification Search
CPC ... C08L 23/06; C08L 23/0815; H01L 31/0481
See application file for complete search history.

(56) References Cited

U.S. PATENT DOCUMENTS

| 6,103,658 A | 8/2000 | Mackenzie et al. |
| 6,660,677 B1 | 12/2003 | Mackenzie et al. |
| 10,030,085 B2 | 7/2018 | Amamiya et al. |
| 2012/0136082 A1* | 5/2012 | Daiss ............... C09D 151/06 521/143 |
| 2012/0152324 A1 | 6/2012 | Corfias-Zuccalli et al. |

FOREIGN PATENT DOCUMENTS

| CN | 101531725 A | 9/2009 |
| CN | 101812145 A | 8/2010 |
| CN | 102827312 A | 12/2012 |
| CN | 102958996 A | 3/2013 |
| CN | 104926962 A | 9/2015 |
| JP | S6419780 A | 1/1989 |
| KR | 20160082087 A | 7/2016 |
| WO | 2010067039 A1 | 6/2010 |

OTHER PUBLICATIONS

SIPO, International Search Report issued in IA Application No. PCT/CN2018/096742, dated Oct. 29, 2018.

* cited by examiner

*Primary Examiner* — Rip A Lee
(74) *Attorney, Agent, or Firm* — Lorenz & Kopf, LLP

(57) ABSTRACT

The present invention discloses an encapsulation composition, an encapsulation film including the encapsulation composition, and an electronic device module. The encapsulation composition includes a polymer matrix, a tackifier and a free radical initiator. Based on 100 parts by weight of the polymer matrix, the polymer matrix includes 5 to 100 parts by weight of highly branched polyethylene (P1), 0 to 95 parts by weight of an ethylene-α-olefin copolymer, and 0 to 70 parts by weight of an ethylene-polar monomer copolymer. The highly branched polyethylene (P1) is an ethylene homopolymer having a branch structure and has a degree of branching of not less than 40 branches/1,000 carbon atoms. A density of the ethylene-α-olefin copolymer is not higher than 0.91 g/cm$^3$. The encapsulation composition provided by the present invention has good volume resistivity, aging resistance, processability and low cost.

17 Claims, No Drawings

ENCAPSULATING COMPOSITION AND ENCAPSULATING FILM COMPRISING SAME AND ELECTRONIC COMPONENT ASSEMBLY

CROSS REFERENCE TO RELATED APPLICATIONS

The present application is the U.S. national phase of and claims priority to International Patent Application No. PCT/CN2018/096742 filed Jul. 24, 2018, which claims the benefit of priority from China National Application No. 201710612989.5, filed on Jul. 25, 2017, China National Application No. 201711364857.1, filed on Dec. 18, 2017, China National Application No. 201711366329.X, filed on Dec. 18, 2017, and China National Application No. 201810804371.3, filed on Jul. 20, 2018, the entire content of each of which is incorporated herein by reference into the present disclosure as if fully set forth herein.

TECHNICAL FIELD

The present invention relates to an encapsulation composition, also relates to application of the encapsulation composition as an encapsulation material in an encapsulation film, application of the encapsulation film in a product and a preparation method of the encapsulation film, and also relates to an electronic device module, such as a solar cell module.

RELATED ART

Solar energy is an inexhaustible energy source, has the advantages of safety, reliability, no noise, no pollution, reproducibility, wide coverage range, etc., and is the most important new energy source at present. The main application form is to convert the solar energy into electric energy through solar cells. With the continuous development of the solar cells, how to prolong the life of the solar cells and reduce the cost of the solar cells by improving encapsulation materials and encapsulation technologies has become one of key problems. A solar cell module includes a solar cell sheet, a glass cover plate, an encapsulation film and a back board material, wherein the encapsulation film is required to have good light transmittance to ensure the luminous flux incident on the solar cell module, and it is required to have sufficiently high adhesion strength between the film and the glass cover plate and the back board film so as to ensure the structural stability of the solar cell module and prevent the penetration of harmful substances.

Due to the existence of solar radiation, the inside of the solar cell module may reach a temperature of 65° C. (or higher) in a using process, so the used encapsulation material must have excellent mechanical properties and creep resistance. An ethylene-vinyl acetate copolymer (EVA) is the most widely used encapsulation material in the present market, such as EVA described in patent JP19870174967. After crosslinking, the EVA meets the aforementioned properties and also has good light transmittance (90% or above), which can meet general requirements for encapsulation of the solar cell module. However, under the action of long-term solar radiation, the EVA will decompose and release acetic acid to corrode the cell sheet. After aging, it shows significant yellowing and severe potential induced degradation (PID), resulting in a decrease in the output power of the solar cell module. In order to make the encapsulation film have better aging resistance, using the polyolefin of which the molecular chain tends to be saturated, such as an ethylene-octylene copolymer (POE), as a polymer matrix of the encapsulation film has become an industry trend. Compared with the EVA encapsulation film, it has significant advantages in aging resistance, electrical properties and water vapor barrier capability, but it is inferior to the traditional EVA in terms of material transparency, adhesion, fluidity and processability. The same problem also exists in double-glass solar cell modules, encapsulation materials, or double-glass encapsulation materials for building decoration. The raw material cost and the crosslinking time of a crosslinked POE encapsulation film are generally higher than those of the EVA encapsulation film, resulting in an increase in production cost. The aforementioned problems with respect to property and cost limit the application of the polyolefin (particularly a polyolefin elastomer) as an encapsulation film in solar cell modules, such as single-glass solar cell modules, double-glass solar cell modules, thin film solar cell modules or double-layer glass solar cells for building decoration, or the use as other forms of encapsulation materials to some extent.

SUMMARY

The present invention is directed to an encapsulation composition capable of being configured to prepare an encapsulation film and an encapsulation material aiming at the technical defects of encapsulation films in solar cell modules and similar encapsulation materials in the prior art. The composition has excellent weather resistance and ultraviolet aging resistance as well as excellent high and low temperature resistance, electrical insulation property and water vapor barrier capability, also has good light transmittance, adhesion and processing efficiency, simultaneously has lower raw material cost, and can meet long-term stable use requirements of various forms of solar cell modules, encapsulation materials and double-layer glass. If an encapsulation material is required to have high reflectivity, it may not have good light transmittance.

In order to realize the above objectives, a technical solution of the present invention provides an encapsulation composition which includes a polymer matrix, a tackifier and a free radical initiator. The polymer matrix includes highly branched polyethylene, and the highly branched polyethylene is a kind of ethylene homopolymer having a degree of branching of not less than 40 branches/1,000 carbon atoms, wherein the highly branched polyethylene is synthetised by catalyzing ethylene homopolymerization through coordination polymerization by adopting a late transition metal catalyst. Preferably, the transition metal catalyst may be one of (α-diimine)nickel and (α-diimine) palladium catalysts.

In a more specific technical solution, an encapsulation composition includes a polymer matrix, a tackifier and a free radical initiator, wherein based on 100 parts by weight of the polymer matrix, the polymer matrix includes 5 to 100 parts by weight of highly branched polyethylene (P1) and 0 to 95 parts by weight of an ethylene-α-olefin copolymer, and the highly branched polyethylene (P1) is an ethylene homopolymer having a branch structure and has a degree of branching of not less than 40 branches/1,000 carbon atoms.

A density of the ethylene-α-olefin copolymer is preferably not higher than 0.91 g/cm$^3$.

In another technical solution, an encapsulation composition includes a polymer matrix, a tackifier and a free radical initiator, wherein based on 100 parts by weight of the polymer matrix, the polymer matrix includes 5 to 100 parts by weight of or 10 to 100 parts by weight of highly branched polyethylene (P1) which is an ethylene homopolymer having a branch structure and has a degree of branching of not less than 40 branches/1,000 carbon atoms, 0 to 95 parts by weight of or 0 to 90 parts by weight of polyolefin (P2) (different from the highly branched polyethylene) which includes at least one of crystalline polyethylene different from the highly branched polyethylene, a propylene homopolymer, an ethylene-α-olefin copolymer, and a binary or ternary or polynary copolymer of monoolefin and diolefin, and 0 to 70 parts by weight of an olefin-polar monomer copolymer, wherein an olefin is one or more of ethylene or other α-olefins.

In order to more clearly distinguish the highly branched polyethylene from polyolefin different from the highly branched polyethylene, in some expressions, the highly branched polyethylene is expressed as P1, and the polyolefin different from the highly branched polyethylene is expressed as P2.

In another technical solution, the present invention provides an encapsulation material which includes the encapsulation composition in the above technical solution and has a sheet form or a film form.

The aforementioned encapsulation material may exist in a crosslinked or partially crosslinked or non-crosslinked form.

In another technical solution, the present invention provides an electronic device module which includes at least one electronic device and an encapsulation material in intimate contact with at least one surface of the electronic device. The encapsulation material includes a polymer matrix, and the polymer matrix includes highly branched polyethylene. The highly branched polyethylene is characterized by being an ethylene homopolymer having a branch structure and has a degree of branching of not less than 40 branches/1,000 carbon atoms, wherein the highly branched polyethylene is synthetised by catalyzing ethylene homopolymerization through coordination polymerization by adopting a late transition metal catalyst. Preferably, the transition metal catalyst may be one of (α-diimine)nickel and (α-diimine)palladium catalysts.

In another technical solution, the present invention provides an electronic device module which includes at least one electronic device and an encapsulation material in intimate contact with at least one surface of the electronic device. The encapsulation composition includes a polymer matrix, a tackifier and a free radical initiator, wherein based on 100 parts by weight of the polymer matrix, the polymer matrix includes 5 to 100 parts by weight of highly branched polyethylene (P1) and 0 to 95 parts by weight of an ethylene-α-olefin copolymer. The highly branched polyethylene (P1) is an ethylene homopolymer having a branch structure and has a degree of branching of not less than 40 branches/1,000 carbon atoms. A density of the ethylene-α-olefin copolymer is not higher than 0.91 g/cm$^3$.

In another technical solution, the present invention provides an electronic device module which includes at least one electronic device and an encapsulation material in intimate contact with at least one surface of the electronic device. The encapsulation material includes a polymer matrix, and the polymer matrix includes 5 to 100 parts by weight of highly branched polyethylene (P1) which is an ethylene homopolymer having a branch structure and has a degree of branching of not less than 40 branches/1,000 carbon atoms, 0 to 95 parts by weight of or 0 to 90 parts by weight of polyolefin (P2) (different from the highly branched polyethylene) which includes at least one of crystalline polyethylene different from the highly branched polyethylene, a propylene homopolymer, an ethylene-α-olefin copolymer, and a binary or ternary or polynary copolymer of monoolefin and diolefin, and 0 to 70 parts by weight of an olefin-polar monomer copolymer, wherein an olefin is one or more of ethylene or other α-olefins.

"In intimate contact" and like terms mean that the encapsulation material is in contact with at least one surface of the device or other products in a similar manner as a coating is in contact with a substrate. For example, a very small gap or space maybe exists between the encapsulation material and the surface of the device, and the material shows good or excellent adhesion to the surface of the device. After the encapsulation material is extruded or applied to at least one surface of the electronic device through other methods, the material is usually formed and/or cured into a film that can be either transparent or opaque and either flexible or rigid.

The module can further comprise one or more other components, such as one or more glass cover sheets. Furthermore, in these embodiments, the encapsulation material is usually located between the electronic device and the glass cover sheet in a sandwich configuration. If the encapsulation material is applied as a film to a surface of the glass cover sheet opposite to the electronic device, a surface of the film that is in contact with the surface of the glass cover sheet can be smooth or uneven, e.g., embossed or textured.

The highly branched polyethylene of the present invention can be synthetised by catalyzing ethylene homopolymerization through coordination polymerization by adopting a late transition metal catalyst. Preferably, the transition metal catalyst may be one of (α-diimine)nickel and (α-diimine)palladium catalysts. In a polymerization process, the degree of branching, molecular weight and melting point can be adjusted by adjusting the structure of the catalyst and polymerization conditions. Specifically, in the case of a certain catalytic system, when a polymerization temperature is higher and a polymerization pressure is lower, a prepared product has a higher degree of branching, a lower molecular weight and a lower melting point; and when the polymerization temperature is lower and the polymerization pressure is higher, the prepared product has lower degree of branching, higher molecular weight and higher melting point. The molecular weight described in the specification is measured by PL-GPC220, and the unit is g/mol.

The highly branched polyethylene adopted by the present invention has a degree of branching of not less than 40 branches/1,000 carbon atoms, preferably 45 to 130 branches/1,000 carbon atoms, and further preferably 60 to 116 branches/1,000 carbon atoms, has a weight average molecular weight of 50,000 to 500,000, and further preferably 200,000 to 450,000, and has a melting point of not higher than 125° C., preferably −44 to 101° C., more preferably not higher than 90° C., and further preferably −30 to 80° C. In every 100 parts by weight of the polymer matrix, an amount of the highly branched polyethylene is preferably 20 to 100 parts by weight, and further preferably 40 to 100 parts by weight.

The highly branched polyethylene adopted by the present invention has a degree of branching of 60 to 85 branches/1,000 carbon atoms preferably, or 62 to 83 branches/1,000 carbon atoms, or 67 to 75 branches/1,000 carbon atoms, has a weight average molecular weight of 100,000 to 200,000 preferably, or 102,000 to 213,000, or 114,000 to 175,000, has a molecular weight distribution of 1.3 to 3.5 preferably, and has a melting point of not higher than 90° C. preferably, 40 to 80° C. preferably, or 55 to 65° C., or 70 to 80° C. A melt index measured at 190° C. and under a load of 2.16 kg may be 0.1 to 50 g/10 min, preferably 5 to 25 g/10 min, further preferably 10 to 20 g/10 min, or 5 to 10 g/10 min, or 10 to 15 g/10 min, or 15 to 20 g/10 min. In every 100 parts by weight of the polymer matrix, the amount of the highly branched polyethylene is 70 to 100 parts by weight preferably.

The α-olefin in the ethylene-α-olefin copolymer of the present invention has 3 to 30 carbon atoms and is selected from propylene, 1-butylene, 1-pentene, 3-methyl-1-butylene, 1-hexene, 4-methyl-1-pentene, 3-methyl-1-pentene, 1-octylene, 1-decene, 1-dodecene, 1-tetradecene, 1-cetene, 1-octadecene, 1-eicosene, 1-docosene, 1-tetracosene, 1-cerotene, 1-octacosene and 1-triacontene. The α-olefin is preferably 1-butylene, 1-hexene, 1-octylene or 1-decene, and further preferably 1-octylene. The ethylene-α-olefin copolymer may be a binary copolymer or a polynary copolymer. A typical ternary copolymer may be an illustrative ternary copolymer including an ethylene/propylene/1-octylene copolymer, an ethylene/propylene/1-butylene copolymer, an ethylene/1-butylene/1-octylene copolymer, and the like. In every 100 parts by weight of the polymer matrix, the amount of the ethylene-α-olefin copolymer is preferably 0 to 70 parts by weight, more preferably 10 to 50 parts by weight, and further preferably 20 to 40 parts by weight. The copolymer may be random or block. The ethylene-α-olefin copolymer is preferably an ethylene-1-octylene copolymer or an ethylene-1-butylene copolymer and further preferably an ethylene-1-octylene copolymer, and is referred to as a polyolefin elastomer (POE) for short in practical applications.

A weight percentage of the α-olefin in the ethylene-α-olefin copolymer is generally 20% to 50%, and preferably 30% to 45%. When a weight percentage of octylene in the ethylene-1-octylene copolymer is 30% to 45%, theoretically, a corresponding tertiary carbon atom ratio is 37.5 to 56.3 tertiary carbon atoms/1,000 carbon atoms, or a corresponding degree of branching is 37.5 to 56.3 branches/1,000 carbon atoms. In order to improve capability and rate of a grafting reaction and/or a crosslinking reaction of the encapsulation composition without significantly affecting aging resistance, the branched polyethylene used in the present invention has a degree of branching of not less than 40 branches/1,000 carbon atoms, and further preferably not less than 60 branches/1,000 carbon atoms.

When the α-olefin in the ethylene-α-olefin copolymer is propylene, the weight percentage of the propylene in the copolymer is preferably higher than 30%, more preferably higher than 50%, and further preferably higher than 70%. In the practice of the present invention, the copolymers including ethylene and propylene may further include one or more diene comonomers for preparing these copolymers, especially suitable dienes for use in preparing EPDM type-polymers, including conjugated or non-conjugated, straight or branched, and monocyclic or polycyclic dienes containing 4 to 20 carbon atoms. Preferably, the dienes include 1,4-pentadiene, 1,4-hexadiene, 5-ethylidene-2-norbornene, dicyclopentadiene, cyclohexadiene and 5-butylidene-2-norbornene. One particularly preferred diene is 5-ethylidene-2-norbornene.

The ethylene homopolymer different from the highly branched polyethylene in the present invention is crystalline polyethylene having a lower degree of branching and a higher melting point, wherein the crystalline polyethylene has a melting point of 80 to 140° C. preferably, and further preferably 90 to 130° C. The crystalline polyethylene can be obtained by polymerization by a Ziegler-Natta catalyst or a metallocene catalyst. The propylene homopolymer is isotactic polypropylene. The polyethylene and polypropylene have crystallinity and can function as physical crosslinking points at a high temperature, thereby ensuring that the polyolefin film has sufficient thermomechanical properties in a thermoplastic state to meet processing and application requirements. In every 100 parts by weight of the polymer matrix, a total amount of the crystalline polyethylene and the polypropylene is preferably 0 to 30 parts by weight, and further preferably 10 to 20 parts by weight. The crystalline polyethylene different from the highly branched polyethylene has a degree of branching of lower than 40 branches/1,000 carbon atoms generally, and preferably lower than 30 branches/1,000 carbon atoms.

Compared with a regular branch distribution of α-olefin introduced into the ethylene-α-olefin copolymer, a specific high branch number and a complicated branch distribution of the highly branched polyethylene can better damage regularity of ethylene molecular chains, reduce crystallinity and increase light transmittance, so that the aforementioned other polyolefins can be partially or completely replaced with the highly branched polyethylene to increase overall light transmittance and fluidity of the composition. On the other hand, cohesion of the highly branched polyethylene is relatively weak, and partial abovementioned other polyolefins are used simultaneously in the highly branched polyethylene, so that overall cohesion of the composition can be increased, and a tendency of cold flow during processing and forming can be reduced. When two or more different polyolefins are used simultaneously, it is expected to enhance impact resistance of a final product.

The olefin used in a preparation process of an olefin-polar monomer copolymer in the present invention includes at least one of olefin monomers, such as ethylene, propylene, 1-butylene, 1-hexene and 1-octylene, and preferably ethylene.

A monomer containing a polar group, used in a preparation process of an ethylene-polar monomer copolymer in the present invention includes, but is not limited to, at least one of vinyl acetate, acrylic acid, methacrylic acid, methyl acrylate, ethyl acrylate, maleic anhydride and vinyl trimethoxysilane, and preferably at least one of an ethylene-vinyl acetate copolymer, an ethylene-maleic anhydride copolymer and an ethylene-vinyl trimethoxysilane copolymer. It should be understood that ethylene-polar monomer copolymers include not only copolymers obtained by direct polymerization of ethylene and monomers containing polar groups, but also copolymers derived during a polymerization reaction of ethylene and monomers containing polar groups. For example, when ethylene is copolymerized with vinyl acetate, a vinyl alcohol copolymer and polyvinyl butyral derived during the polymerization reaction should also be included in the meaning of the ethylene-polar monomer copolymers. In the present invention, an ethylene-polar monomer copolymer is preferably an ethylene-vinyl acetate copolymer (EVA). In every 100 parts by weight of the polymer matrix, the amount of the EVA is preferably 0 to 70 parts by weight, and further preferably 0 to 30 parts by weight, and a melt index of the EVA is preferably 14 to 45 g/10 min, more preferably 13 to 30 g/10 min, further preferably 5 to 10 g/10 min, or 10 to 15 g/10 min, or 15 to 20 g/10 min.

When the amount of the EVA is lower, a main objective is to improve the overall light transmittance of the composition by adding a small amount of EVA, and to provide a certain adhesion, thereby effectively reducing amounts of the tackifier and the free radical initiator. Because a cost of the EVA is lower than that of the POE, a production cost of the film can also be reduced. When the amount of the EVA is higher, a main objective is to improve weather resistance, aging resistance and yellowing resistance of the EVA by introducing saturated polyolefin into the EVA, and to increase volume resistivity and water vapor barrier property, thereby improving an electrical insulation property. Because the highly branched polyethylene has a higher crosslinking rate than the POE, the highly branched polyethylene can be more easily co-crosslinked with the EVA to exert the aforementioned beneficial effects.

Ethylene homopolymers, ethylene-α-olefin copolymers, or other saturated polyolefins are of saturated fatty chain structures which do not contain polar groups and have poor adhesion, therefore, under the condition that the encapsulation composition does not contain an olefin-polar monomer copolymer or the olefin-polar monomer copolymer cannot provide sufficient adhesion, it is necessary to enhance the adhesion by adding the tackifier.

In the present invention, based on 100 parts by weight of the polymer matrix, an amount of the tackifier is 0 to 10 parts, and further preferably 0.01 to 10 parts; a lower limit of the amount of the tackifier is further preferably 0.1 part, or 0.2 part, or 0.5 part, or 1 part; an upper limit of the amount of the tackifier is further preferably 5 parts, or 4 parts, or 3 parts, or 2 parts; and specifically, the amount of the tackifier may be preferably 0.1 to 5 parts, or 0.2 to 4 parts, or 0.5 to 2 parts.

The tackifier in the present invention refers to a polar monomer that can introduce a polar functional group to a polymer molecular chain through reaction ways such as grafting to increase adhesion of a polymer film. The polar monomer includes at least one olefinic degree of unsaturation and one polar group. The polar group of the polar monomer can be selected from at least one of a carbonyl group, a carboxylic ester group, a carboxylic anhydride group, a siloxane group, a titanyl alkyl group and an epoxidized group.

The tackifier of the present invention is preferably a silane coupling agent containing a siloxane group, wherein the used silane coupling agent has a functional group, such as at least one of a vinyl group, an acryloyl group, an amino group, a chlorine group and a phenoxy group. Specifically, the used tackifier can be selected from at least one of vinyl trimethoxysilane, vinyl triethoxysilane, vinyltri(methoxyethoxy)silane, vinyltriacetoxysilane, γ-(methyl)acryloyloxypropyltrimethoxysilane, γ-aminopropyltriethoxysilane and γ-ketoacryloxypropyltrimethoxysilane.

In the present invention, based on 100 parts by weight of the polymer matrix, an amount of the silane coupling agent may be 0.1 to 5 parts by weight, and preferably 0.5 to 5 parts by weight, 1 to 5 parts by weight, 1 to 4 parts by weight, or 1 to 3 parts by weight. When the amount of the silane coupling agent is less than 0.1 part by weight, adhesion of the prepared encapsulation composition may be deteriorated. On the other hand, when the amount of the silane coupling agent exceeds 5 parts by weight, considering the reaction efficiency, more free radical initiators should be used, so that it is difficult to control the physical properties of the encapsulation composition, and the physical properties of the encapsulation composition may be deteriorated.

The tackifier of the present invention may also be a titanate coupling agent which can be added according to a conventional amount.

The tackifier of the present invention may also be a composite tackifier composed of a silane coupling agent and a titanate coupling agent, the composite tackifier can be added according to a conventional amount, an amount of the composite tackifier is preferably 0.2 to 2 parts by weight, and a specific weight of the silane coupling agent in the composite tackifier is preferably higher than 70%.

The tackifier of the present invention may also be an organic compound at least containing one olefinic degree of unsaturation (such as double bonds) and one carbonyl group. Suitable and common polar monomers are carboxylic acids, anhydrides, esters and metallic and non-metallic salts thereof. Preferably, an organic compound containing an olefinic degree of unsaturation conjugated with a carbonyl group may be selected from at least one of maleic acid, fumaric acid, acrylic acid, methacrylic acid, itaconic acid, crotonic acid, α-methyl crotonolic acid, cinnamic acid and anhydride, ester and salt derivatives thereof, and preferably maleic anhydride. Based on 100 parts by weight of the polymer matrix, an amount of the organic compound for tackifying may be 0.01 to 10 parts, preferably 0.05 to 5 parts, and further preferably 0.1 to 2 parts.

All of the aforementioned tackifiers are usually grafted onto the polymer matrix by any conventional method in the presence of free radical initiators such as peroxides and azo-compounds, or by ionizing radiation. The graft-modified polymer matrix is preferably highly branched polyethylene (P1).

A specific conventional grafting method may be as follows: a polymer is added to a double-roller mixer and is mixed at an appropriate temperature such as 60° C., then, an unsaturated organic compound and a free radical initiator such as benzoyl peroxide are added together, and the components are mixed at 30° C. until the grafting is completed. Another type of grafting method is similar, except that a reaction temperature is higher (such as 210 to 300° C.), the free radical initiator may be not used, or a use concentration of the free radical initiator may be reduced.

In another embodiment of the present invention, a polymer matrix also includes a grafted polymer to provide adhesion between a cover sheet and an electronic device, the grafted polymer is a polyolefin polymer grafted with an unsaturated organic compound, the unsaturated organic compound may be selected from the aforementioned tackifiers and specifically is a polar monomer containing at least one olefinic degree of unsaturation and one polar group, and the polar group includes at least one of a carbonyl group, a carboxylic ester group, a carboxylic anhydride group, a siloxane group, a titanyl alkyl group and an epoxidized group.

The grafted polymer is usually selected from saturated polyolefins, more usually selected from the aforementioned highly branched polyethylene (P1) and the polyolefin (P2) different from the highly branched polyethylene, and preferably P1. At least a part of P1 and/or P2 is grafted with a grafting material through a conventional grafting reaction. The used unsaturated organic compound is preferably a vinyl silane coupling agent or maleic anhydride.

On a saturated polyolefin molecular chain, it is relatively easy for tertiary carbon atoms to generate free radicals under an action of a free radical initiator, and then undergo a grafting reaction with a tackifier (such as a silane coupling agent) to obtain modified polyolefin. Therefore, an increase of an amount of the tertiary carbon atoms in the polyolefin molecular chain is favorable for increasing a grafting efficiency with the silane coupling agent, thereby being favorable for improving a tackifying effect or reducing amounts of the silane coupling agent and the free radical initiator under a condition of meeting the same adhesion requirements, reducing an influence on an electrical insulation property of the film, and reducing the cost. In an existing encapsulation film production technology, the most commonly used ethylene-α-olefin copolymer is an ethylene-octylene copolymer, each long branch only corresponds to one tertiary carbon atom located on a backbone, a ratio of the tertiary carbon atoms in a total number of polymer carbon atoms is generally not higher than 5%, the highly branched polyethylene generally may have more tertiary carbon atoms due to a unique branch structure, the ratio of the tertiary carbon atoms in the total number of the polymer carbon atoms is generally not less than 5%, and partial tertiary carbon atoms maybe located on branches to reduce the influence of chain scission on overall properties of the polymer to a certain extent. Therefore, by replacing the ethylene-octylene copolymer in the prior art partially or completely with the highly branched polyethylene, under the same modification conditions, the whole can be endowed with better grafting efficiency and adhesion. A preferred solution is as follows: a part of or all of highly branched polyethylene in the polymer matrix is blended and grafted with all silane coupling agents and necessary free radical initiators firstly, higher grafting efficiency can be obtained, and grafting conditions can be changed; however, a melting temperature ranges usually between 160° C. and 260° C. and preferably between 190° C. and 230° C., and depends on a retention time and a half-life period of the initiator; and due to better fluidity, the highly branched polyethylene can be more uniformly dispersed into the whole during blending with other components.

When the polymer matrix directly contains the polyolefin grafted and modified by a polar monomer, because the polymer matrix has a certain adhesion, a formula of the encapsulation composition may be free of tackifiers and may also be free of olefin-polar monomer copolymers. However, the above situation is equivalent to that add tackifiers to the encapsulation composition in advance. Therefore, in this case, a technical solution without olefin-polar monomer copolymers and without tackifiers is still within the scope of the technical solution of the present invention.

In the present invention, preferably, the encapsulation composition is processed into a crosslinked film, then, the crosslinking and the curing of the saturated polyolefin generally require the participation of the free radical initiator, and the crosslinking and the curing can increase thermal creep resistance of the polymer matrix and durability of the module in terms of heat resistance, impact resistance and solvent resistance.

The free radical initiator in the present invention can be selected from at least one of a peroxide, an azo-initiator and a photo-initiator, and is preferably a thermally activated compound such as a peroxide and an azo-initiator.

The thermally activated free radical initiator in the present invention specifically can be selected from dialkyl peroxide, diperoxyketal, an azo-initiator and the like, and more specifically can be selected from at least one of di-tert-butyl peroxide, dicumyl peroxide, tert-butyl cumyl peroxide, 1,1-di(tert-butylperoxide)-3,3,5-trimethylcyclohexane, 2,5-dimethyl-2,5-di(tert-butylperoxy)hexane, 2,5-dimethyl-2,5-di(tert-butylperoxy)-hexyne-3,1,4-bis-tert-butylperoxycumene, tert-butyl peroxybenzoate, tert-butylperoxy-2-ethylhexyl carbonate, benzoyl peroxide, tert-butyl peroxyneodecanoate, tert-butyl peroxyacetate, tert-butyl percaprylate, methyl ethyl ketone peroxide and azodiisobutyronitrile. The free radical initiator is preferably a variety which has good heat stability and cannot easily produce by-products that affect the aging resistance of the polymer, such as tert-butylperoxy-2-ethylhexyl carbonate.

The polymer matrix in the encapsulation composition of the present invention can also be crosslinked and cured by methods such as radiation crosslinking, photo-crosslinking, moisture crosslinking and silane coupling. When the radiation crosslinking is adopted, a radiation source can be selected from at least one of infrared radiation, electron beams, β-rays, γ-rays, x-rays and neutron rays, and an appropriate amount of a conventional radiation sensitizer can be added. When the photo-crosslinking is adopted, a light source can be selected from sunlight and ultraviolet light, and photo-initiators include organic carbonyl compounds, such as benzophenone, benzanthrone, benzoin and alkyl ether thereof, 2,2-diethoxy acetophenone, 2,2-dimethoxy-2-phenylacetophenone, p-phenoxydichloroacetophenone, 2-hydroxycyclohexylphenyl ketone, 2-hydroxyisopropylphenyl ketone and 1-phenylpropanedione-2-(ethoxycarboxy)oxime. These initiators are used in known conventional modes according to conventional amounts. When the moisture crosslinking is adopted, it is generally preferred to use one or more hydrolysis/complex catalysts. These catalysts include Lewis acid, such as dibutyltin dilaurate, dioctyltin dilaurate, stannous octoate and hydrogen sulfonates (such as sulfonic acid).

In the present invention, based on 100 parts by weight of the polymer matrix, the amount of the free radical initiator may be preferably 0.05 to 10 parts by weight, and further preferably 0.05 to 5 parts by weight. When a crosslinking-type film is produced, the amount of the free radical initiator may be 0.1 to 10 parts by weight, and preferably 0.1 to 5 parts by weight, 0.2 to 4 parts by weight, 1 to 4.5 parts by weight or 1 to 4 parts by weight sequentially. When the amount of the free radical initiator is less than 0.1 part by weight, the efficiency of a manufacturing process is too low, and it is insufficient for the crosslinking degree of the prepared encapsulation composition to impart sufficient crosslinking degree and creep strength to the encapsulation film. On the other hand, when the amount of the free radical initiator exceeds 10 parts by weight, an increase in the generation of a large number of active free radicals may cause a large number of side reactions. For example, due to the existence of a branch structure, a β scission reaction occurs on a molecular backbone, thereby reducing the physical properties of the encapsulation composition.

In a production technology of producing a crosslinking-type encapsulation film, the implementation technical solution of the present invention is listed as follows: in every 100 parts by weight of the polymer matrix, the amount of the highly branched polyethylene is preferably 30 to 100 parts by weight, and further preferably 70 to 100 parts by weight. Based on 100 parts by weight of the polymer matrix, the amount of the free radical initiator of the encapsulation composition is 0.1 to 10 parts by weight.

In the present invention, the ethylene-α-olefin copolymer is partially or completely replaced with the highly branched polyethylene, so that it is expected to shorten the crosslinking and curing time and increase the production efficiency. This is because on a saturated polyolefin molecular chain, tertiary carbon atoms are most likely to form free radicals, and then, a crosslinking reaction occurs between tertiary carbon free radicals to achieve a curing effect. The tertiary carbon atoms of a commonly used ethylene-α-olefin copolymer such as an ethylene-octylene copolymer in the prior art are all located on a backbone, so that the movement is not free and the steric hindrance is larger in a crosslinking process. The ratio of the tertiary carbon atoms in the highly branched polyethylene is generally higher than that of the commonly used ethylene-α-olefin copolymer, and partial tertiary carbon atoms maybe distribute on branches, so that the steric hindrance could be smaller, the spatial movement could be relatively free, and fast crosslinking and curing are facilitated.

In order to obtain better processability and use properties, the encapsulation composition of the present invention includes a free radical activator, an ultraviolet absorbent, a light stabilizer and an antioxidant, and further includes at least one of additives, such as a glass fiber, a plasticizer, a nucleator, a chain extender, a flame retardant, an inorganic filler, a scorch retarder, a heat conduction filler, a metal ion trapping agent, a colorant, a brightener and an anti-reflection modifier. Based on 100 parts by weight of the polymer matrix, an amount of the free radical activator is 0 to 10 parts by weight, and preferably 0.05 to 2 parts by weight; an amount of the scorch retarder is 0 to 2 parts by weight; an amount of the ultraviolet absorbent is 0 to 2 parts by weight, and preferably 0.05 to 1 part by weight and 0.1 to 0.8 part by weight sequentially; an amount of the antioxidant is 0 to 5 parts by weight, and preferably 0.1 to 1 part by weight and 0.2 to 0.5 part by weight sequentially; and an amount of the light stabilizer is 0 to 5 parts by weight, and preferably 0.05 to 2 parts by weight and 0.1 to 1 part by weight sequentially.

The free radical activator of the present invention can prolong the service life of macromolecular free radicals generated by hydrogen abstraction by the initiator, and has auxiliary effects on the grafting reaction and crosslinking and curing. For a crosslinking process, the free radical activator can be referred to as an auxiliary crosslinking agent. The free radical activator can be selected from at least one of triallyl cyanurate, triallyl isocyanurate, ethylene glycol dimethacrylate, triethylene glycol dimethacrylate, triallyl trimellitate, trimethylolpropane trimethacrylate, N,N'-m-phenylene bismaleimide, N,N'-bis(furfurylidene)acetone and low-molecular-weight 1,2-polybutadiene, wherein the triallyl cyanurate, the triallyl isocyanurate, the ethylene glycol dimethacrylate, the triethylene glycol dimethacrylate and trimethacrylate trimethylolpropane can also be used as radiation sensitizers.

One difficulty in using thermally activated free radical initiators to promote crosslinking of thermoplastic materials is that thermally activated free radical initiators may initiate premature crosslinking, i.e., scorching, during compounding and/or processing prior to the actual phase in the overall process in which curing is desired. The gel particles generated by scorching can adversely impact the homogeneity of a final product. Moreover, excessive scorching can also reduce the plastic properties of the material, so that the material cannot be efficiently processed with the likely possibility that the entire batch will be lost. Therefore, in the present invention, a scorch retarder can also be added to inhibit scorching. One commonly used scorch retarder for use in a composition containing a free radical (particularly peroxide) initiator is a 4-hydroxy-2,2,6,6-tetramethylpiperidine-1-oxy free radical also known as 4-hydroxy-TEMPO. The addition of the 4-hydroxy-TEMPO inhibits scorching by "quenching" free radical crosslinking of a crosslinkable polymer at a melt processing temperature. Based on 100 parts by weight of the polymer matrix, the amount of the scorch retarder is 0 to 2 parts by weight, preferably 0.01-1.5 parts by weight, and more preferably 10% to 50% of the weight of the free radical initiator.

In order to prolong the service life of the module, the ultraviolet absorbent of the present invention is selected from benzophenones or benzotriazoles, and the light stabilizer is selected from hindered amine compounds or piperidine compounds. Preferably, a benzotriazole ultraviolet absorbent and a hindered amine light stabilizer are used simultaneously.

The ultraviolet absorbent of the present invention is selected from benzophenone compounds, such as 2-hydroxy-4-methoxybenzophenone, 2,2-dihydroxy-4-methoxybenzophenone and 2-hydroxy-4-n-octyloxybenzophenone, benzotriazole compounds, such as 2-(2'-hydroxy-3',5'-di-tert-butylphenyl)-benzotriazole and 2-(2'-hydroxy-5'-methylphenyl)-benzotriazole, and salicylate compounds, such as phenyl salicylate and octylphenyl salicylate. The light stabilizer of the present invention is selected from at least one of bis(2,2,6,6-tetramethyl-4-piperidinyl)sebacate, bis(1-octyloxy-2,2,6,6-tetramethyl-4-piperidinyl)sebacate, a grafted copolymer obtained by polymerization of 4-(meth)acryloyloxy-2,2,6,6-tetramethylpiperidine and α-olefinic monomers, 3,5-di-tert-butyl-4-n-hexadecyl hydroxybenzoate, tris(1,2,2,6,6-pentamethylpiperidine)phosphite, succinic acid and a polymer of 4-hydroxy-2,2,6,6-tetramethyl-1-piperidinol.

The antioxidant of the present invention can be selected from at least one of a hindered phenol antioxidant and a phosphite antioxidant, and preferably, the hindered phenol antioxidant and the phosphite antioxidant are used simultaneously. Specifically, the antioxidant can be selected from at least one of 2,2'-methylenebis(4-methyl-6-tert-butylphenol), 2,2'-methylenebis(4-ethyl-6-tert-butylphenol), tetrakis(3,5-di-tert-butyl-4-hydroxy)phenylpropanoate pentaerythritol ester, bis(2,4-dicumylphenyl)pentaerythritol diphosphite, di stearyl pentaerythritol diphosphite, tris(nonylphenyl)phosphite, tris(2,4-di-tert-butylphenyl)phosphite, tris(1,2,2,6,6-pentamethylpiperidine)phosphite and 3,5-di-tert-butyl-4-hydroxy-n-hexadecyl benzoate.

The types and amounts of glass fibers or glass bubbles of the present invention are well known to those skilled in the art, and the thermal shrinkage deformation of the film can be effectively controlled.

In the present invention, a plasticizer can also be added to improve the processing fluidity and increase the production efficiency and the film forming homogeneity. The plasticizer is selected from paraffin mineral oil, naphthenic oil and aromatic mineral oil, and preferably paraffin mineral oil. Furthermore, the plasticizer can also increase the wettability of the composition to an adherend so as to further increase the adhesion. The plasticizer can also be selected from at least one of phthalate, azelate, adipate and tricresyl phosphate.

In the present invention, a nucleator can also be added to enable the composition to realize heterogeneous nucleation during a crystallization process, thereby reducing the grain size and increasing the light transmittance. The nucleator is selected from dibenzylidene sorbitol and derivatives thereof: at least one of dibenzylidene sorbitol, 1,3:2,4-di-p-methylbenzylidene sorbitol, 1,3:2,4-bis(p-ethyl)benzyl sorbitol and bis-(3,4-dimethylbenzylidene)sorbitol, and preferably 1,3:2,4-di-p-methylbenzylidene sorbitol.

In the present invention, a flame retardant can also be added. The flame retardant can be selected from one or more of nano aluminum hydroxide, nano magnesium hydroxide, nano silicon dioxide, nano zinc oxide and nano titanium dioxide, can be further selected from one or more of nano aluminum hydroxide, nano magnesium hydroxide, nano silicon dioxide, nano zinc oxide and nano titanium dioxide processed by a coupling agent, can also be selected from one or more of phosphate flame retardants, such as bisphenol A bis(diphenyl phosphate), triphenyl phosphate and resorcinol bis(diphenyl phosphate), and can also be selected from microencapsulated intumescent flame retardants, such as microencapsulated melamine polyphosphate. The aforementioned different types of flame retardants can also be used in combination according to the prior art in this field.

The encapsulation film of the present invention can also be added with an inorganic filler, such as one or more of silicon dioxide, titanium dioxide, aluminum oxide, calcium carbonate, montmorillonite and carbon nano tubes.

In the present invention, an auxiliary agent with a light conversion function can also be added to absorb ultraviolet light in a specific waveband in sunlight and emit visible light in a specific waveband, thereby reducing the aging effect of the ultraviolet light on a photovoltaic module and simultaneously increasing the spectral conversion efficiency of the module. The auxiliary agent with a light conversion function can be selected from organic compounds with large conjugated groups in molecular structures, such as one or more of distyrylbisbenzoxazole, 2,5-bis(5-tert-butyl-2-benzooxazolyl)thiophene and 4,4-bis(5-methyl-2-benzoxazolyl)stilbene, can also be selected from mixed rare earth complexes of β-diketone and pyridine derivatives, and can also be selected from one or more of polymerizable fluorescent monomers. The polymerizable fluorescent monomer can be selected from one or more of acrylates, methacrylates or organic metal chelates of acrylates and methacrylates of europium, yttrium, samarium, cerium, terbium, dysprosium, gadolinium, lanthanum and scandium.

In the present invention, an anti-reflection modifier which participates in a crosslinking reaction can also be added to further damage the crystalline structure of the polyolefin and increase the light transmittance. The anti-reflection modifier can be selected from one or a mixture of more than two of an ethylene-methyl methacrylate copolymer, a bifunctional aliphatic urethane acrylate prepolymer, a bifunctional epoxy acrylate prepolymer, a bifunctional polyester acrylate prepolymer, a trifunctional polyether acrylate prepolymer, a trifunctional aliphatic urethane acrylate prepolymer, a tetrafunctional polyester acrylate prepolymer, a tetrafunctional epoxy acrylate prepolymer, a tetrafunctional polyether acrylate prepolymer, a hexafunctional aliphatic urethane acrylate prepolymer and a hexafunctional epoxy acrylate prepolymer. Based on 100 parts by weight of the polymer matrix, the amount of the anti-reflection modifier is preferably 0.1 to 1.5 parts by weight, and further preferably 0.5 to 1 part by weight.

In the present invention, one or more of a chain extender, a colorant, a brightener, a bonding additive (such as polyisobutylene) and the like can also be added to realize or improve the corresponding properties known in this field. The use modes and amounts of these and other potential additives are the same as those generally known in this field.

In an implementation mode of the present invention, the present invention provides an encapsulation material which includes the aforementioned encapsulation composition, has a sheet form or a film form, and specifically may be an encapsulation film. Specific processing methods include, but are not limited to, a T-shaped mold extrusion method and a calendering method.

In a specific implementation mode, an electronic device module provided by the present invention is a solar cell module. The electronic device module specifically includes (a) at least one electronic device, typically a plurality of such devices arrayed in a linear or planar pattern, (b) at least one glass cover sheet, typically a glass cover sheets over two surfaces of the device, and (c) at least one encapsulation material. The encapsulation material is generally disposed between the glass cover sheet and the electronic device, and the encapsulation material shows good adhesion to both the device and the cover sheet. If the device needs to be in contact with specific forms of electromagnetic radiation, e.g., sunlight, infrared rays, ultraviolet rays, etc., the polymer material shows good, generally excellent, transparency for the radiation. If transparency is not a requirement for operation of the electronic device or one side requires a better reflection effect, the polymer material can contain opaque fillers and/or pigments.

A solar cell module provided by the present invention at least includes one layer of encapsulation film structurally, and at least one layer of the encapsulation film includes the aforementioned encapsulation composition. Words related to "solar" in the present invention may be equivalent to "photovoltaic". For example, the solar cell module can also be understood as a photovoltaic cell module.

The present invention provides a solar cell module with two layers of encapsulation film, including a supporting substrate, a solar cell (electronic device), a light receiving substrate and the encapsulation film. The two layers of encapsulation film are respectively placed between the supporting substrate and the solar cell and between the light receiving substrate and the solar cell, and at least one of the two layers should include the aforementioned encapsulation composition. The solar cell could be crystalline silicon solar cell sheet or thin film solar cell sheet.

In the present invention, the supporting substrate serves to protect a back side of the solar cell module from the external environment influence and requires weather resistance. In the present invention, the supporting substrate includes at least one of a glass plate, a metal plate such as foil (or aluminum), a fluorine resin sheet, a cyclic polyolefin resin sheet, a polycarbonate resin sheet, a polyacrylic resin sheet, a polymethacrylic resin sheet, a polyamide resin sheet, a polyester resin sheet, or a composite sheet in which a weather-resistant film and a barrier film are laminated.

In the present invention, the light receiving substrate formed on the solar cell may realize functions of preventing the internal solar power generation body from being affected by weather, external impact, fire and the like, and ensuring the long-term reliability of the solar cell module exposed outdoors. The light receiving substrate of the present invention is not particularly limited to any specific kind, as long as the light receiving substrate has excellent light permeability, electrical insulation property and mechanical or physicochemical strength. For example, at least one of a glass plate, a fluorine resin sheet, a cyclic polyolefin resin sheet, a polycarbonate resin sheet, a polyacrylic resin sheet, a polymethacrylic resin sheet, a polyamide resin sheet and a polyester resin sheet may be used. In an exemplary embodiment of the present invention, a glass plate having excellent heat resistance may be used preferably.

In the present invention, the encapsulation film configured to encapsulate the solar cell inside the solar cell module, especially between the supporting substrate and the light receiving substrate, may include the aforementioned encapsulation composition according to the present application, and has excellent adhesion for the supporting substrate and the light receiving substrate as well as excellent transparency, heat stability, ultraviolet stability and the like, thereby prolonging the service life of the solar cell module.

The present invention provides a solar cell module with one layer of encapsulation film, including a supporting substrate, a solar cell, a light receiving substrate and the encapsulation film. The encapsulation film is disposed between the supporting substrate and the solar cell or between the light receiving substrate and the solar cell, and includes the aforementioned encapsulation composition.

The aforementioned solar cell module encapsulated by one layer of film may be a thin film solar cell module, and a solar cell thereof usually can be formed on a light receiving substrate composed of ferroelectrics by a chemical vapor deposition method.

Under the condition that the encapsulation film according to the present invention is used, after the light receiving substrate is laminated, the solar cell, the supporting substrate and the encapsulation film according to the required module structure may be configured to prepare the aforementioned solar cell module through a hot pressing device of vacuum suction.

The present invention provides a double-layer glass, and an encapsulation material used for the double-layer glass includes the aforementioned encapsulation composition.

The present invention provides an encapsulation material which includes the aforementioned encapsulation composition.

The aforementioned encapsulation material has a sheet structural form or a film structural form.

A method for preparing an encapsulation film including the aforementioned encapsulation composition includes the following steps:

step 1, uniformly mixing a polymer matrix, a tackifier and a free radical initiator with other components, and then, putting a mixture into an extruder at one time for blending and extruding, wherein the other components refer to the components other than the polymer matrix, the tackifier and the free radical initiator in the encapsulation composition;

step 2, casting an extrudate to form a film;

step 3, cooling and pulling the film for shaping; and step 4, finally, performing coiling to obtain the encapsulation film.

A method for preparing an encapsulation film including the aforementioned encapsulation composition includes the following steps:

step a, firstly, performing blending, grafting and extruding on a part of or all of a polymer matrix, all of a tackifier and a free radical initiator with a weight of 3% to 20% of that of the tackifier through an extruder to obtain a graft-modified polymer matrix A;

step b, uniformly mixing the polymer matrix A with other components, and then, putting a mixture into the extruder for blending and extruding, wherein the other components refer to the components other than the polymer matrix A in the encapsulation composition;

step c, casting an extrudate to form a film;

step d, cooling and pulling the film for shaping; and step e, finally, performing coiling to obtain the encapsulation film.

In another implementation plan, a polymer material in intimate contact with at least one surface of the electronic device in the electronic device module of the present invention is a co-extruded material, wherein at least one external surface layer does not contain peroxide. If the co-extruded material includes three layers, the surface layer in contact with the module does not contain peroxide, and a core layer contains peroxide. The external surface layer has good adhesion to one or both of the glass and the electronic device.

In another implementation plan, the electronic device in the electronic device module of the present invention is encapsulated in the encapsulation material, that is, the electronic device is completely located or enclosed in the encapsulation material. In another variation of these implementation plans, the cover layer is processed with a silane coupling agent, such as γ-aminopropyltriethoxysilane. In another variation of these implementation plans, the encapsulation material also includes a grafted polymer to increase the adhesion thereof to one or both of the electronic device and the cover layer. The grafted polymer is usually prepared in situ simply by grafting the highly branched polyethylene with an unsaturated organic compound containing a carbonyl group, such as maleic anhydride.

The present invention has the following beneficial effects:

(1) compared with an olefin copolymer (POE) encapsulation film in the prior art, the encapsulation film prepared by using the encapsulation composition of the present invention may have better processability (such as processing efficiency) and low cost;

(2) compared with an EVA encapsulation film in the prior art, the encapsulation film prepared by using the encapsulation composition of the present invention has better weather resistance, aging resistance and yellowing resistance, also has excellent electrical insulation property and water vapor barrier capability, and can prolong the service life of a solar cell.

DETAILED DESCRIPTION

The following embodiments are given to further illustrate the present invention, but are not intended to limit the scope of the present invention. Some non-essential improvements and adjustments made by those skilled in the art to the present invention according to the content of the present invention still fall within the protection scope of the present invention.

A first embodiment of the present invention provides an encapsulation composition which includes a polymer matrix, a tackifier and a free radical initiator. Based on 100 parts by weight of the polymer matrix, the polymer matrix includes 5 to 100 parts by weight of highly branched polyethylene (P1) and 0 to 95 parts by weight of an ethylene-α-olefin copolymer. The highly branched polyethylene (P1) is an ethylene homopolymer having a branch structure and has a degree of branching of not less than 40 branches/1,000 carbon atoms. A density of the ethylene-α-olefin copolymer is not higher than 0.91 g/cm$^3$.

A second embodiment of the present invention provides an encapsulation composition which includes a polymer matrix, a free radical initiator and a tackifier. Every 100 parts by weight of the polymer matrix includes 5 to 100 parts by weight of highly branched polyethylene (P1), 0 to 30 parts by weight of crystalline polyethylene and polypropylene, 0 to 95 parts by weight of an ethylene-α-olefin copolymer, and 0 to 70 parts by weight of an ethylene-polar monomer copolymer. Based on 100 parts by weight of the polymer matrix, the amount of the free radical initiator is 0.1 to 5 parts by weight, and the amount of the tackifier is 0.1 to 5 parts by weight.

A third embodiment of the present invention provides an encapsulation composition which includes a polymer matrix, a tackifier and a free radical initiator. The polymer matrix is highly branched polyethylene.

The used highly branched polyethylene is synthetised by catalyzing ethylene homopolymerization through coordination polymerization by adopting a late transition metal catalyst. Preferably, the transition metal catalyst may be one of (α-diimine)nickel and (α-diimine)palladium catalysts. In terms of cost, the (α-diimine)nickel catalyst is preferred. The structure and the synthesis method of the used (α-diimine)nickel catalyst and the method for preparing branched polyethylene by the (α-diimine)nickel catalyst are disclosed in the prior art, the following literatures can be adopt, but are not limited to: CN102827312A, CN101812145A, CN101531725A, CN104926962A, U.S. Pat. Nos. 6,103,658, and 6,660,677. A cocatalyst can be selected from one or more of aluminum diethyl monochloride, aluminum ethyl dichloride, ethyl aluminum sesquichloride, methylaluminoxane and modified methylaluminoxane.

The basic parameters, such as the degree of branching, the molecular weight and the melting point of the used highly branched polyethylene can be adjusted by adjusting the structure of the catalyst and polymerization conditions. The highly branched polyethylene adopted by the present invention has a degree of branching of not less than 40 branches/1,000 carbon atoms, further preferably 45 to 130 branches/1,000 carbon atoms, further preferably 60 to 116 branches/1,000 carbon atoms, and further preferably 62 to 83 branches/1,000 carbon atoms, has a weight average molecular weight of 50,000 to 500,000, further preferably 200,000 to 450,000, or 100,000 to 200,000, 102,000 to 213,000, or 114,000 to 175,000, and has a melting point of not higher than 125° C., further preferably −44 to 101° C., further preferably not higher than 90° C., further preferably −30 to 80° C., further preferably 40 to 80° C., or 55 to 65° C., or 70 to 80° C. A melt index measured at 190° C. and under a load of 2.16 kg may be 0.1 to 50 g/10 min, preferably 5 to 25 g/10 min, further preferably 10 to 20 g/10 min, or 5 to 10 g/10 min, or 10 to 15 g/10 min, or 15 to 20 g/10 min. In every 100 parts by weight of the polymer matrix, the amount of the highly branched polyethylene is 70 to 100 parts by weight preferably.

The used ethylene-α-olefin copolymer is an ethylene-octylene copolymer (POE).

The used ethylene-polar monomer copolymer is an ethylene-vinyl acetate copolymer (EVA).

The used free radical initiator is a peroxide crosslinking agent, such as tert-butylperoxy-2-ethylhexyl carbonate.

The used tackifier is a silane coupling agent, such as vinyl trimethoxysilane, vinyl triethoxysilane and vinyltri(methoxyethoxy)silane.

In an embodiment, auxiliary components can be added to the encapsulation composition to obtain or improve various properties in a targeted manner.

The auxiliary components include a free radical activator, an ultraviolet absorbent, a light stabilizer, an antioxidant, a glass fiber, a plasticizer, a nucleator, a chain extender, a flame retardant, an inorganic filler, a scorch retarder, a heat conduction filler, a metal ion trapping agent, a colorant, a brightener, an anti-reflection modifier, a bonding additive and the like, and the auxiliary components are used according to conventional amounts.

A preparation method of an encapsulation film including the aforementioned encapsulation composition includes the following steps:

(1) firstly, performing blending, grafting and extruding on a part of or all of a polymer matrix, all of a tackifier and a free radical initiator with a weight of 3% to 20% of that of the tackifier through an extruder to obtain a graft-modified polymer matrix A, wherein a temperature of the extruder is controlled at 50 to 210° C.; and (2) uniformly mixing the polymer matrix A with other components and then putting a mixture into the extruder for blending and extruding, casting an extrudate to form a film, cooling and pulling the film for shaping, and finally, performing a coiling process to obtain the encapsulation film, wherein the temperature of the extruder is controlled at 80 to 210° C.

In order to more clearly describe the embodiments of the present invention, the materials involved in the embodiments of the present invention are defined as below.

The highly branched polyethylene used in the embodiments has a degree of branching of 46 to 130 branches/1,000 carbon atoms, a weight average molecular weight of 66,000 to 471,000, and a melting point of −44 to 101° C., wherein the degree of branching is measured by nuclear magnetic resonance, the molecular weight and the molecular weight distribution are measured by PL-GPC220, and the melting point is measured by differential scanning calorimetry.

The details are as follows:

| Number of highly branched polyethylene | Degree of branching | Weight average molecular weight/10,000 | Molecular weight distribution | Melting point/° C. |
|---|---|---|---|---|
| PER-1 | 130 | 6.6 | 2.2 | −44 |
| PER-2 | 116 | 20.1 | 2.1 | −30 |
| PER-3 | 105 | 26.8 | 2.1 | −17 |
| PER-4 | 102 | 27.9 | 2.1 | 2 |
| PER-5 | 98 | 28.3 | 1.8 | 16 |
| PER-6 | 92 | 32.1 | 1.9 | 38 |
| PER-7 | 82 | 35.6 | 1.7 | 52 |
| PER-8 | 72 | 28.3 | 1.9 | 60 |
| PER-9 | 70 | 39.6 | 2.0 | 71 |
| PER-10 | 63 | 42.8 | 2.2 | 76 |
| PER-11 | 52 | 31 | 1.8 | 85 |
| PER-12 | 46 | 47.1 | 2.3 | 101 |
| PER-13 | 62 | 21.3 | 2.1 | 84 |
| PER-14 | 67 | 17.5 | 1.9 | 66 |
| PER-15 | 70 | 13.6 | 2.0 | 63 |
| PER-16 | 72 | 12.2 | 1.9 | 57 |
| PER-17 | 75 | 11.4 | 2.1 | 56 |
| PER-18 | 83 | 10.2 | 2.0 | 54 |

Property Test Method:

(1) Crosslinking degree and peel strength: the crosslinking degree and the peel strength were measured according to GB/T 29848-2013 standards.

(2) Light transmittance: samples were tested by a spectrophotometer method according to GB/T 2410-2008. A wavelength range of the spectrophotometer was set to be 290 to 1,100 nm. Averages of the light transmittance in waveband ranges of 290 to 380 nm and 380 to 1,100 nm were respectively calculated. At least three samples were tested in each group, and the test results were averaged. The light transmittance described in the embodiments of the present invention was directed to a test result in the waveband range of 380 to 1,100 nm.

(3) Volume resistivity: firstly, the samples were put in a laboratory at 23° C.±2° C. and 50%±5% RH for at least 48 h, then, the volume resistivity of the samples was tested under the conditions of 1,000 V±2 V and electrochemical time of 60 min according to requirements specified in GB/T 1410-2006, three samples were tested, and the results were averaged.

(4) Humidity, heat and aging resistance and yellowing index: firstly, all samples were put into a high-temperature and high-humidity aging test box, and test conditions were set as follows: the temperature was 85° C.±2° C., and the relative humidity was 85%±5%; the test time was 1,000 h, the samples were taken out after the test and were restored for 2 to 4 h in an open environment with a relative humidity of less than 75% at 23° C.±5° C., then, an appearance inspection was performed, and no appearance defects were required; and finally, the yellowing indexes of laminate samples before and after the test were respectively measured according to ASTM E313, no less than three points were measured for each sample, the yellowing index of the sample was the average of the measured points, and the difference of change in yellowing indexes before and after aging was recorded.

(5) PID resistance test: the test was performed at 85° C. and 85 RH % with a voltage of −1,000V.

Embodiments 1 to 8 and Comparative Example 1

Encapsulation film and crosslinking speed test thereof:

Encapsulation compositions of which the polymer matrixes were respectively DOW ENGAGE 8137 and PER-15 were compared, under the following formula, the optimum vulcanization time Tc90 of the test was performed according to the national standard GB/T16584-1996, the test was performed in a rotorless vulcanizer, the test temperature was 150° C., and the test duration was 30 min. The formula includes 100 parts by weight of polymer matrix, 1 part by weight of vinyl trimethoxysilane, 1 part by weight of tert-butylperoxy-2-ethylhexyl carbonate, 0.5 part by weight of triallyl isocyanurate, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A polymer matrix and liquid components were soaked and mixed, a mixture and other components were blended and extruded in an extruder, the extrusion temperature was controlled at 90±1° C., the retention time of the mixture in the extruder was 4 min, an extrudate was cast to form a film, the film was cooled, split and coiled to obtain a transparent encapsulation film having a thickness of 0.5 mm, samples were cut and folded into about 5 g of samples to be tested, and then, the test was performed, wherein specific proportions of DOW ENGAGE 8137 and PER-15 in polymer matrixes and the corresponding Tc90 were shown in table 1:

TABLE 1

| Polymer matrix | Embodiment 1 | Embodiment 2 | Embodiment 3 | Embodiment 4 | Embodiment 5 | Embodiment 6 | Embodiment 7 | Embodiment 8 | Comparative example 1 |
|---|---|---|---|---|---|---|---|---|---|
| PER-15 content | 100 | 95 | 90 | 70 | 50 | 30 | 10 | 5 | 0 |
| DOW ENGAGE 8137 content | 0 | 5 | 10 | 30 | 50 | 70 | 90 | 95 | 100 |
| Tc90/s | 429 | 447 | 471 | 542 | 633 | 721 | 782 | 805 | 820 |

By comparing Embodiments 1 to 8 with Comparative Example 1, it can be clearly found that the crosslinking speed of the highly branched polyethylene with an appropriate degree of branching was significantly higher than that of a polyolefin copolymer commonly used in the prior art. When the polymer matrix of an encapsulation composition or an encapsulation material partially or completely adopts the highly branched polyethylene, under the same processing conditions, the crosslinking speed can be effectively increased to shorten the crosslinking and curing time required for modules during processing and shaping, so that on the one hand, the energy consumption can be effectively reduced and the production capacity can be increased, and on the other hand, electronic devices, such as solar cell sheets, can be protected to shorten the retention time thereof at high temperature and high pressure.

Embodiments 9 to 16 and Comparative Examples 1 and 2

The formula components of Embodiments 9 to 16 and Comparative Examples 2 and 3 were shown in table 2: (based on every 100 parts by weight of the polymer matrix, parts by weight of all components were listed)

TABLE 2

| Component | Embodiment 9 | Embodiment 10 | Embodiment 11 | Embodiment 12 | Embodiment 13 | Embodiment 14 | Embodiment 15 | Embodiment 16 | Comparative Example 1 | Comparative Example 2 |
|---|---|---|---|---|---|---|---|---|---|---|
| Number of PER | PER-6 | PER-15 | PER-7 | PER-7 | PER-8 | PER-2/PER-10 | PER-6 | PER-6 | | |
| PER amount | 100 | 100 | 100 | 100 | 100 | 40/60 | 60 | 30 | | |
| EVA(VA: 33%, MI: 30) | | | | | | | | 70 | | 100 |
| POE(octylene: 40%, MI: 30) | | | | | | | 40 | | 100 | |
| Silane coupling agent: vinyl trimethoxysilane | 1 | 1 | 2 | 5 | 1 | 1 | 1 | 0.1 | 1 | 0.1 |

TABLE 2-continued

| Component | Embodiment 9 | Embodiment 10 | Embodiment 11 | Embodiment 12 | Embodiment 13 | Embodiment 14 | Embodiment 15 | Embodiment 16 | Comparative Example 1 | Comparative Example 2 |
|---|---|---|---|---|---|---|---|---|---|---|
| Peroxide: tert-butylperoxy-2-ethylhexyl carbonate | 1 | 1 | 2 | 5 | 1 | 1 | 1 | 1 | 1 | 1 |
| Auxiliary crosslinking agent: triallyl isocyanurate | 0.5 | 0.5 | 0.5 | 2 | 0.5 | 0.5 | 0.5 | 0.5 | 0.5 | 0.5 |
| Antioxidant: tetrakis(3,5-di-tert-butyl-4-hydroxy)phenylpropanoate pentaerythritol ester | 0.15 | 0.15 | 0.15 | 0.15 | 0.15 | 0.15 | 0.15 | 0.15 | 0.15 | 0.15 |
| Antioxidant: bis(2,4-dicumylphenyl)pentaerythritol diphosphite | 0.15 | 0.15 | 0.15 | 0.15 | 0.15 | 0.15 | 0.15 | 0.15 | 0.15 | 0.15 |
| Light stabilizer: bis(2,2,6,6-tetramethyl-4-piperidinyl)sebacate | 0.15 | 0.15 | 0.15 | 0.15 | 0.15 | 0.15 | 0.15 | 0.15 | 0.15 | 0.15 |
| Ultraviolet absorbent: 2-(2'-hydroxy-3',5'-di-tert-butylphenyl)-benzotriazole | 0.15 | 0.15 | 0.15 | 0.15 | 0.15 | 0.15 | 0.15 | 0.15 | 0.15 | 0.15 |

An encapsulation composition according to each of Embodiments 9 to 16 was mixed through an internal mixer and then calendered or extruded to form a film having a thickness of 0.5 mm, a flat glass and a TFT back board were respectively attached to two surfaces of the film, and then, the obtained laminates were laminated in a vacuum laminator.

The property test data of each test sample was shown in table 3:

the highly branched polyethylene as a polymer matrix has excellent transparency, which ensures that a solar cell using the encapsulation film has good power generation efficiency. Secondly, the encapsulation film using the highly branched polyethylene as the polymer matrix has good peel strength with glass, and after humidity, heat and aging resistance, the retention rate of the peel strength between the encapsulation film and the glass was much higher than the retention rate of the peel strength between an EVA encapsulation film in the

TABLE 3

| Property test | Embodiment 9 | Embodiment 10 | Embodiment 11 | Embodiment 12 | Embodiment 13 | Embodiment 14 | Embodiment 15 | Embodiment 16 | Comparative Example 2 | Comparative Example 3 |
|---|---|---|---|---|---|---|---|---|---|---|
| Crosslinking degree/% | 79 | 79 | 84 | 90 | 76 | 82 | 76 | 81 | 73 | 84 |
| Light transmittance/% | 92 | 91 | 92 | 92 | 88 | 90 | 90 | 91 | 89 | 91 |
| Peel strength with glass/(N/cm) | 134 | 121 | 138 | 145 | 118 | 129 | 131 | 112 | 124 | 128 |
| Volume resistivity/ ($10^{15}$ Ω · cm) | 18.5 | 25.2 | 18.6 | 14.1 | 22.7 | 20.2 | 13.3 | 4.2 | 8.2 | 2.8 |
| After humidity, heat and aging resistance | | | | | | | | | | |
| Peel strength with glass/(N/cm) | 114 | 105 | 121 | 109 | 107 | 111 | 113 | 80 | 110 | 75 |
| Yellowing index (ΔYI) | 1.1 | 0.9 | 0.9 | 1 | 0.8 | 1 | 1 | 2.7 | 1 | 3.4 |

By comparing Embodiment 8, Embodiment 15 and Comparative Example 2, it can be found that by adopting the highly branched polyethylene to partially or completely replace the POE in the prior art, an encapsulation film can be endowed with better crosslinking degree, light transmittance, volume resistivity and adhesion with glass.

By comparing Embodiments 9 to 14 with Comparative Example 3, it can be found that an encapsulation film using Comparative Example and the glass, and the yellowing index of the encapsulation film was also much lower than the yellowing index of the EVA encapsulation film in the Comparative Example, thereby indicating that the encapsulation film using the highly branched polyethylene as the polymer matrix in the present invention has excellent adhesion and humidity, heat and aging resistance and can be better adapted to outdoor environments. The novel encapsulation film provided by the present invention adopts the highly branched polyethylene of which the molecular chain is of a completely saturated hydrocarbon structure, so that the novel encapsulation film has very high volume resistivity and has significant advantages relative to the EVA encapsulation film in terms of electrical insulation property.

By comparing Embodiment 16 with Comparative Example 3, it can be found that by adopting the highly branched polyethylene to partially replace the EVA in the prior art, the humidity, heat and aging resistance of the EVA encapsulation film can be significantly improved, the yellowing index was reduced, the electrical insulation property was improved, the property defects of the existing EVA encapsulation film were well improved, and although the adhesion strength between the encapsulation film and the glass was reduced, it still meets the industry standard higher than 60 N/cm.

Embodiment 17

Single-Glass Solar Cell Module:

An encapsulation film having a thickness of 0.5 mm was prepared from an encapsulation composition including the following substances: 100 parts by weight of PER-13 (MI at 190° C. and under a load of 2.16 kg was 1 g/10 min), 1 part by weight of vinyl trimethoxysilane, 1 part by weight of tert-butylperoxy-2-ethylhexyl carbonate, 0.5 part by weight of triallyl isocyanurate, 0.05 part by weight of 4-hydroxy-TEMPO, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A polymer matrix and liquid components were soaked and mixed, a mixture and other components were blended and extruded in an extruder, the extrusion temperature was controlled at 90±1° C., the retention time of the mixture in the extruder was 4 min, an extrudate was cast to form a film, and the film was cooled, split and coiled to obtain an encapsulation film having a thickness of 0.5 mm. A solar cell module was prepared by a laminating method at 145° C., wherein the encapsulation film was located between a glass cover plate and a solar cell and also located between a TPT back board and the solar cell. PID resistance test: after 192 h of testing, the output power attenuation degree was 0.82%.

Embodiment 18

Single-Glass Solar Cell Module:

An encapsulation film having a thickness of 0.5 mm was prepared from an encapsulation composition including the following substances: 90 parts by weight of PER-14 (MI at 190° C. and under a load of 2.16 kg was 5 g/10 min), 10 parts by weight of a maleic anhydride modified ethylene-1-octylene copolymer (grafting content of MAH is 1 wt %, MI:1.5 g/10 min), 1 part by weight of vinyl trimethoxysilane, 1 part by weight of tert-butylperoxy-2-ethylhexyl carbonate, 0.5 part by weight of triallyl isocyanurate, 0.05 part by weight of 4-hydroxy-TEMPO, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A polymer matrix and liquid components were soaked and mixed, a mixture and other components were blended and extruded in an extruder, the extrusion temperature was controlled at 90±1° C., the retention time of the mixture in the extruder was 4 min, an extrudate was cast to form a film, and the film was cooled, split and coiled to obtain an encapsulation film having a thickness of 0.5 mm. A solar cell module was prepared by a laminating method at 145° C., wherein the encapsulation film was located between a glass cover plate and a solar cell and also located between a TPT back board and the solar cell. PID resistance test: after 192 h of testing, the output power attenuation degree was 0.88%.

Embodiment 19

Single-Glass Solar Cell Module:

An encapsulation film having a thickness of 0.5 mm was prepared from an encapsulation composition including the following substances: 70 parts by weight of PER-15 (MI at 190° C. and under a load of 2.16 kg was 13 g/10 min), 30 parts by weight of Dow POE8137, 1 part by weight of vinyl trimethoxysilane, 1 part by weight of tert-butylperoxy-2-ethylhexyl carbonate, 0.5 part by weight of triallyl isocyanurate, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A polymer matrix and liquid components were soaked and mixed, a mixture and other components were blended and extruded in an extruder, the extrusion temperature was controlled at 90±1° C., the retention time of the mixture in the extruder was 4 min, an extrudate was cast to form a film, and the film was cooled, split and coiled to obtain an encapsulation film having a thickness of 0.5 mm. A solar cell module was prepared by a laminating method at 145° C., wherein the encapsulation film was located between a glass cover plate and a solar cell and also located between a TPT back board and the solar cell. PID resistance test: after 192 h of testing, the output power attenuation degree was 0.81%.

Embodiment 20

Single-Glass Solar Cell Module:

An encapsulation film having a thickness of 0.5 mm was prepared from an encapsulation composition including the following substances: 100 parts by weight of PER-18 (MI at 190° C. and under a load of 2.16 kg was 30 g/10 min), 1 part by weight of vinyl trimethoxysilane, 1 part by weight of tert-butylperoxy-2-ethylhexyl carbonate, 0.5 part by weight of triallyl isocyanurate, 0.05 part by weight of 4-hydroxy-TEMPO, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A processing method was as follows: all polymer matrixes, all silane coupling agents and peroxides of which the weight was 10% of the weight of the silane coupling agents were mixed uniformly, and then, a mixture was added to a double screw extruder for blending and extruding; the temperature of a feed end of the double screw extruder was 50° C., the temperature of a reactor injected with nitrogen gas was 210° C., the temperature of an outlet after reaction was 140° C., and a graft-modified polymer matrix A was obtained; the graft-modified polymer matrix A and other components were mixed uniformly, and then, the mixture was extruded into a film in cooperation with a T-shaped mold through the double screw extruder; nitrogen gas was injected into the extruder, and the extrusion temperature was controlled at 110° C.; the retention time of the mixture in the extruder was 4 min; and an extrudate was cast to form a film, and the film was cooled, split and coiled to obtain an encapsulation film having a thickness of 0.5 mm. A solar cell module was prepared by a laminating method at 145° C., wherein the encapsulation film was located between a glass cover plate and a solar cell and also located between a TPT back board and the solar cell. PID resistance test: after 192 h of testing, the output power attenuation degree was 0.83%.

Embodiment 21

Double-Glass Solar Cell Module in which Two Layers of Films were Transparent Films:

An encapsulation film having a thickness of 0.5 mm was prepared from an encapsulation composition including the following substances: 100 parts by weight of PER-16 (MI at 190° C. and under a load of 2.16 kg was 13 g/10 min), 1 part by weight of vinyl trimethoxysilane, 1 part by weight of tert-butylperoxy-2-ethylhexyl carbonate, 0.5 part by weight of triallyl isocyanurate, 0.05 part by weight of 4-hydroxy-TEMPO, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A polymer matrix and liquid components were soaked and mixed, a mixture and other components were blended and extruded in an extruder, the extrusion temperature was controlled at 90±1° C., the retention time of the mixture in the extruder was 4 min, an extrudate was cast to form a film, and the film was cooled, split and coiled to obtain an encapsulation film having a thickness of 0.5 mm. A solar cell module was prepared by a laminating method at 145° C., wherein the solar cell was an N-type cell sheet, and the encapsulation film was located between a glass cover plate and the solar cell and also located between another glass cover plate and the solar cell. PID resistance test: after 192 h of testing, the output power attenuation degree was 0.63%.

Embodiment 22

Double-Glass Solar Cell Module in which an Upper Layer was a Transparent Film and a Lower Layer was a White Film:

An upper-layer encapsulation film having a thickness of 0.5 mm was prepared from an encapsulation composition including the following substances: 100 parts by weight of PER-16 (MI at 190° C. and under a load of 2.16 kg was 13 g/10 min), 1 part by weight of vinyl trimethoxysilane, 1 part by weight of tert-butylperoxy-2-ethylhexyl carbonate, 0.5 part by weight of triallyl isocyanurate, 0.05 part by weight of 4-hydroxy-TEMPO, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A polymer matrix and liquid components were soaked and mixed, a mixture and other components were blended and extruded in an extruder, the extrusion temperature was controlled at 90±1° C., the retention time of the mixture in the extruder was 4 min, an extrudate was cast to form a film, and the film was cooled, split and coiled to obtain a transparent encapsulation film having a thickness of 0.5 mm.

A lower-layer encapsulation film having a thickness of 0.5 mm was prepared from an encapsulation composition including the following substances: 100 parts by weight of PER-16 (MI at 190° C. and under a load of 2.16 kg was 13 g/10 min), 10 parts by weight of titanium dioxide powder, 1 part by weight of vinyl trimethoxysilane, 1 part by weight of tert-butylperoxy-2-ethylhexyl carbonate, 0.5 part by weight of triallyl isocyanurate, 0.05 part by weight of 4-hydroxy-TEMPO, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A polymer matrix and liquid components were soaked and mixed, a mixture and other components were blended and extruded in an extruder, the extrusion temperature was controlled at 90±1° C., the retention time of the mixture in the extruder was 4 min, an extrudate was cast to form a film, and the film was cooled, split and coiled to obtain a transparent encapsulation film having a thickness of 0.5 mm.

A solar cell module was prepared by a laminating method at 145° C., wherein the solar cell was an N-type cell sheet, the transparent encapsulation film was located between an upper-layer glass cover plate and the solar cell, and the white film was located between a lower-layer glass cover plate and the solar cell. PID resistance test: after 192 h of testing, the output power attenuation degree was 0.68%.

Embodiment 23

Double-Glass Solar N-Type Double-Sided Cell Module in which a Cell was an N-Type Double-Sided Cell and Two Layers of Films were Transparent Films:

An encapsulation film having a thickness of 0.5 mm was prepared from an encapsulation composition including the following substances: 100 parts by weight of PER-16 (MI at 190° C. and under a load of 2.16 kg was 13 g/10 min), 1 part by weight of vinyl trimethoxysilane, 1 part by weight of tert-butylperoxy-2-ethylhexyl carbonate, 0.5 part by weight of triallyl isocyanurate, 0.05 part by weight of 4-hydroxy-TEMPO, 0.25 part by weight of tetrakis(3,5-di-tert-butyl-4-hydroxy)phenylpropanoate pentaerythritol ester, 0.15 part by weight of bis(2,2,6,6-tetramethyl-4-piperidinyl)sebacate, and 0.15 part by weight of 2-hydroxy-4-n-octyloxybenzophenone. A polymer matrix and liquid components were soaked and mixed, a mixture and other components were blended and extruded in an extruder, the extrusion temperature was controlled at 90±1° C., the retention time of the mixture in the extruder was 4 min, an extrudate was cast to form a film, and the film was cooled, split and coiled to obtain an encapsulation film having a thickness of 0.5 mm. A solar cell module was prepared by a laminating method at 145° C., wherein the solar cell was an N-type double-sided cell sheet, and the encapsulation film was located between a glass cover plate and a solar cell and also located between another glass cover plate and the solar cell. PID resistance test: after 192 h of testing, the output power attenuation degree was 1.52%.

In general, under the condition that the content of the highly branched polyethylene is higher, the encapsulation film including the encapsulation composition of the present invention has excellent weather resistance, aging resistance, yellowing resistance and electrical insulation property and good optical properties and adhesion, and has obvious advantages compared with an existing EVA encapsulation film and an existing POE encapsulation film. Under the condition that the content of the highly branched polyethylene is lower, it is also expected to improve the property defects of the EVA encapsulation film and the POE encapsulation film. Theoretically, the production cost of the highly branched polyethylene is significantly lower than that of the POE, and the crosslinking speed of the highly branched polyethylene is higher than that of the POE, thereby reducing the time cost and increasing the production efficiency for photovoltaic module suppliers. Therefore, from the perspective of property and cost, the solution of the present invention has obvious advantages than the prior art.

The above embodiments are merely preferred embodiments of the present invention, and are not intended to limit the protection scope of the present invention. Any non-essential changes and replacements made by those skilled in the art on the basis of the present invention fall within the protection scope of the present invention.

What is claimed is:

1. An encapsulation composition, comprising a polymer matrix, a tackifier and a free radical initiator, wherein based on 100 parts by weight of the polymer matrix, the polymer matrix comprises 5 to 100 parts by weight of highly branched polyethylene (P1) and 0 to 95 parts by weight of an ethylene-α-olefin copolymer, and the highly branched polyethylene (P1) is an ethylene homopolymer having a branch structure and has a degree of branching of not less than 60 branches/1,000 carbon atoms.

2. The encapsulation composition according to claim 1, wherein the highly branched polyethylene (P1) is synthetised by catalyzing ethylene homopolymerization by a late transition metal catalyst and has a weight average molecular weight of 100,000 to 220,000.

3. The encapsulation composition according to claim 1, wherein an α-olefin in the ethylene-α-olefin copolymer has 3 to 30 carbon atoms and is selected from at least one of propylene, 1-butylene, 1-pentene, 3-methyl-1-butylene, 1-hexene, 4-methyl-1-pentene, 3-methyl-1-pentene, 1-octylene, 1-decene, 1-dodecene, 1-tetradecene, 1-cetene, 1-octadecene, 1-eicosene, 1-docosene, 1-tetracosene, 1-cerotene, 1-octacosene or 1-triacontene, and a density of the ethylene-α-olefin copolymer is not higher than 0.91 g/cm$^3$.

4. The encapsulation composition according to claim 1, wherein a melting point of the P1 and the ethylene-α-olefin copolymer is not higher than 90° C.

5. The encapsulation composition according to claim 1, wherein based on 100 parts by weight of the polymer matrix, an amount of the tackifier contained in the encapsulation composition is not less than 0.1 part by weight.

6. The encapsulation composition according to claim 1, wherein the tackifier is a polar monomer comprising at least one olefinic degree of unsaturation and one polar group, and the polar group comprises at least one of a carbonyl group, a carboxylic ester group, a carboxylic anhydride group, a siloxane group, a titanyl alkyl group or an epoxidized group.

7. The encapsulation composition according to claim 1, wherein the tackifier is a silane coupling agent and is selected from at least one of vinyl trimethoxysilane, vinyl triethoxysilane, vinyltri(methoxyethoxy)silane, vinyltriacetoxysilane, γ-(meth)acryloyloxypropyltrimethoxysilane, γ-aminopropyltriethoxysilane or γ-acryloxypropyltrimethoxysilane.

8. The encapsulation composition according to claim 1, wherein based on 100 parts by weight of the polymer matrix, an amount of the free radical initiator contained in the encapsulation composition is not less than 0.1 part by weight.

9. The encapsulation composition according to claim 8, wherein the free radical initiator comprises at least one of a peroxide, an azo-initiator or a photo-initiator, and the peroxide is selected from at least one of di-tert-butyl peroxide, dicumyl peroxide, tert-butyl cumyl peroxide, 1,1-di(tert-butylperoxide)-3,3,5-trimethylcyclohexane, 2,5-dimethyl-2,5-di(tert-butylperoxy)hexane, 2,5-dimethyl-2,5-di(tert-butylperoxy)-hexyne-3, 1,4-bis-tert-butylperoxycumene, tert-butyl peroxybenzoate, tert-butylperoxy-2-ethylhexyl carbonate, benzoyl peroxide, tert-butyl peroxyneodecanoate, tert-butyl peroxyacetate, tert-butyl percaprylate or methyl ethyl ketone peroxide.

10. The encapsulation composition according to claim 1, wherein the encapsulation composition also comprises at least one of a free radical activator, an ultraviolet absorbent, a light stabilizer, an antioxidant, a glass fiber, a plasticizer, a nucleator, a chain extender, a flame retardant, an inorganic filler, a scorch retarder, a heat conduction filler, a metal ion trapping agent, a colorant, a brightener, a bonding additive or an anti-reflection modifier.

11. The encapsulation composition according to claim 1, wherein based on 100 parts by weight of the polymer matrix, the encapsulation composition further comprises:
  0.05 to 10 parts of a free radical activator,
  0 to 2 parts by weight of an ultraviolet absorbent,
  0 to 5 parts by weight of an antioxidant,
  0 to 5 parts by weight of a light stabilizer, and
  0 to 2 parts by weight of a scorch retarder,
  wherein the ultraviolet absorbent is selected from at least one of a benzophenone compound, a benzotriazole compound or a salicylate compound, and the light stabilizer is selected from at least one of a hindered amine compound or a piperidine compound.

12. The encapsulation composition according to claim 1, wherein the polymer matrix further comprises a polyolefin polymer grafted with an unsaturated organic compound, the unsaturated organic compound is a polar monomer comprising at least one olefinic degree of unsaturation and one polar group, and the polar group comprises at least one of a carbonyl group, a carboxylic ester group, a carboxylic anhydride group, a siloxane group, a titanyl alkyl group or an epoxidized group.

13. The encapsulation composition according to claim 12, wherein the unsaturated organic compound is a vinyl silane coupling agent or maleic anhydride, and the polyolefin polymer grafted with the unsaturated organic compound is selected from at least one of the P1 or the ethylene-α-olefin copolymer.

14. An encapsulation material, comprising the encapsulation composition according to claim 13 and having a sheet form or a film form.

15. An electronic device module, comprising an electronic device and an encapsulation material in intimate contact with a surface of the electronic device, wherein the encapsulation material comprises the encapsulation composition according to claim 13.

16. The electronic device module according to claim 15, wherein the electronic device is a solar cell.

17. The electronic device module according to claim 15, wherein the electronic device module further comprises at least one glass cover sheet.

* * * * *